US011585866B2

(12) United States Patent
Valdivia Avila et al.

(10) Patent No.: US 11,585,866 B2
(45) Date of Patent: Feb. 21, 2023

(54) LOSS OF NEUTRAL VOLTAGE CONNECTION DETECTION

(71) Applicant: Honeywell International Inc., Morris Plains, NJ (US)

(72) Inventors: Juan Valdivia Avila, Middlesex, NC (US); Scott Holdsclaw, Raleigh, NC (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/175,810

(22) Filed: Feb. 15, 2021

(65) Prior Publication Data
US 2022/0011381 A1 Jan. 13, 2022

Related U.S. Application Data

(60) Provisional application No. 63/049,009, filed on Jul. 7, 2020.

(51) Int. Cl.
G01R 31/66 (2020.01)

(52) U.S. Cl.
CPC .................... G01R 31/66 (2020.01)

(58) Field of Classification Search
CPC .... G01R 31/66; G01R 19/2513; H01H 83/14; Y04S 10/52
See application file for complete search history.

(56) References Cited

U.S. PATENT DOCUMENTS

| 7,079,365 | B2 | 7/2006 | Brown et al. |
| 7,164,273 | B2 | 1/2007 | Bailey |
| 7,847,562 | B2 | 12/2010 | Montgomery et al. |
| 8,891,219 | B2* | 11/2014 | Czarnecki ............... H02H 3/20 361/91.1 |
| 9,941,795 | B1* | 4/2018 | Mayega ............... G01R 19/003 |
| 10,223,906 | B2 | 3/2019 | Meranda et al. |
| 10,761,129 | B2* | 9/2020 | Nakash ............ G01R 31/2827 |
| 10,868,417 | B2* | 12/2020 | Oldham, Jr. ............ H02H 3/20 |
| 2007/0258175 | A1 | 11/2007 | Montgomery et al. |
| 2010/0102826 | A1* | 4/2010 | Edwards ................. H02H 3/50 324/543 |
| 2014/0361784 | A1* | 12/2014 | Satoh ................... G01R 31/52 324/509 |
| 2015/0061690 | A1* | 3/2015 | Curtis ................... G01R 31/52 324/509 |

(Continued)

FOREIGN PATENT DOCUMENTS

| CN | 105759164 A | 7/2016 |
| EP | 2950111 B1 | 6/2017 |

(Continued)

Primary Examiner — Akm Zakaria
(74) Attorney, Agent, or Firm — Ortiz & Lopez, PLLC; Luis M. Ortiz; Kermit D. Lopez

(57) ABSTRACT

Methods and systems for detecting a neutral voltage connection, involve determining when a value of a neutral current is equal to zero, wherein the neutral current comprises a difference between a current flowing through two legs of an electrical meter to an end customer, wherein each of the two legs comprises a first voltage with respect to a ground and a second voltage with respect to one another; and verifying that the neutral current has been detected to zero, in response to determining that the value of the neutral current is equal to zero.

14 Claims, 4 Drawing Sheets

(56) References Cited

U.S. PATENT DOCUMENTS

2019/0302175 A1* 10/2019 Nakash ................ G01R 27/18

FOREIGN PATENT DOCUMENTS

| IN | 271525 B | 2/2016 |
| KR | 101139671 B1 | 3/2012 |
| MY | 150946 A | 3/2014 |
| MY | 146230 A | 7/2017 |
| WO | 2018191436 | 10/2018 |

* cited by examiner

Form 2S
3-Wire

LOSS OF NEUTRAL VOLTAGE CONNECTION DETECTION

CROSS-REFERENCE TO PROVISIONAL APPLICATION

This patent application claims priority under 35 U.S.C. § 119(e) to U.S. Provisional Patent Application Ser. No. 63/049,009 entitled "Loss of Neutral Voltage Connection Detection," which was filed on Jul. 7, 2020, the disclosure of which is incorporated herein by reference in its entirety.

TECHNICAL FIELD

Embodiments relate to electrical meters including residential meters. Embodiments further relate to methods, systems, and devices for detecting the loss of a neutral voltage connection in an electrical meter.

BACKGROUND

Most residential meters in the United States are of a specific type of meter known as Form 2S. The Form 2S meter defines the external physical connections of the meter, and what measurements are typically made. An example connection diagram of a prior art meter 101 is shown in FIG. 1. The prior art meter 101 depicted in FIG. 1 includes a blade 102, a blade 104, a blade 106, and a blade 108. A current sensor 110 can be located in the current path between the blade 102 and the blade 108. Another current sensor 114 can be located in the current path between the blade 104 and the blade 106. A voltage sensor 112 can be located in a path between the blade 102 and the blade 104.

A disconnect link 105 (which is closed in a normal operation) can also be located in series with the voltage sensor 112 and between the voltage sensor 112 and the blade 104. The energy calculation of the meter can involve multiplying the average of the two currents (measured by the current sensor 110 and a current sensor 114) with the voltage measured between the blade 102 and the blade 104. Thus, the calculation of the average of the two currents measured by the current sensor 110 and the current sensor 114 can be implemented as either: (1) two separate current sensors whose outputs are combined in the metrology portion of a meter to a single usable average current value, or (2) they may be combined into a single current sensor whose single output is similarly used in the metrology portion of the meter.

Form 2S meters such as the meter 101 shown in FIG. 1 and the meter 201 in FIG. 2 are most typically used with single-phase 3-wire services. In these types of services, there are two "hot" lines, which can be provided to the end customer, as indicated by wire 240 and wire 244, which each have 120V with respect to ground 242, and which are 240V away from each other. The meter can include blades including a blade 202, a blade 204, a blade 206 and a blade 208. The line or utility side of the meter can be provided across the top of the meter, and the two top blades (blade 202 and blade 204) can be typically 240V apart from each other. The lower two blades (blade 206 and blade 208) can be the load or customer side of the meter, again 240V apart from each other. Current can flow through each blade, top to bottom on the meter 201 (i.e., the left side top to bottom in FIG. 2 is one current path, and the right side top to bottom in FIG. 2 is the second current path).

As mentioned above, the two "hot" lines (which are 240V apart) can be electrically connected to the meter 201. Each of these lines may also be 120V away from the Neutral or ground connection of the service. However, the Neutral or ground connections 223 and 222 in wire 242 may not be electrically made to the meter 201. The wire 242 can be typically tied to the Neutral connection of the utility transformer 220 and can also be tied to a ground connection 223 at the utility transformer 220 from which the voltages can be sourced. This scenario can also exist in the home with respect to a wire 252 being supplied by the meter 201, but may not be available to the meter 201.

A proper way to meter this type of service may be with a full 2-element Form 12S meter 301 as shown in FIG. 3. Each element would have a voltage and a current. One element would multiply the voltage sensed by 312 from the left voltage blade 302 to the Neutral voltage blade 309 times the current in the left blade sensed by 310. The second element would multiply the voltage sensed by 314 from the right voltage blade 304 to Neutral voltage blade 309 times the current in the right blade sensed by 316. The sum of these two energy measurements would equal the total energy supplied by the meter to the load.

The Form 2S meter in FIG. 2 takes a shortcut and assumes that the Neutral voltage 252 is the center point between the two "hot" voltage lines 254 and 256. If this is the case, then the Form 2S meter may also meter accurately. It may not be 'perfect', but has been historically close enough for the relatively low revenue generating meters to offset the additional cost of a full 2-element meter such as the Form 12S. And, because the vast majority of installed electricity meters use this particular meter form, this type of meter will likely continue to be used for the foreseeable future.

There is an issue with this single-phase 3-wire service, however, which can result in very destructive problems. Typically, in a residence, there are 240V loads and 120V loads. The 240V loads (as represented in FIG. 2 by impedance or load 228) can be applied across the two "hot" lines (i.e., wire 254 and 256) from the meter. The 120V loads (as represented by the impedances or loads 224 and 226) may be applied across either "hot" line (i.e., wire 254 or wire 256) to the Neutral connection 252). However, if the Neutral connection from the transformer is lost (as represented by the switch 250 being opened), then the Neutral connection in the residence 252 will float to the electrical center point based on the loads (i.e., load 224 and load 226) from each "hot" leg (254 and 256) to Neutral 252. If the load 224 and the load 226 are perfectly balanced (same load on each "hot" leg), then the current magnitude will be the same on both legs and the "Floating Neutral" 252 will be at the same voltage as Neutral 242. However, if the loads 224 and 226 differ, which is extremely likely, then the "Floating Neutral" point 252 will not be at the center point between the two "hot" voltages 254 and 256.

If the "Floating Neutral" point 252 is not at the center point between the two "hot" voltages 254 and 256, then this means that the voltage seen by the 120V loads will not be the same. If, for example, the Neutral voltage was 5V off of where is should be, then the voltage on one "hot" leg 256 would be 115V with respect to 252 and the other "hot" leg 254 would be at 125V with respect to 252. Most loads could handle this amount of voltage variation. But if there is a large imbalance on the loads and the Neutral voltage is 40V off the center point, that would mean that one "hot" leg 256 would be 80V with respect to 252 and the other "hot" leg 254 would be at 160V with respect to 252. The loads 224 with 80V may or may not work properly, but probably will not be damaged. But the loads 226 with 160V applied to them may become seriously damaged to the point of destruction.

Being able to detect this condition and even potentially able to do something about it would be very advantageous to the homeowner and/or the utility, depending on whose property the Neutral connection became disconnected.

BRIEF SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is, therefore, one aspect of the disclosed embodiments to provide for improved electrical meters.

It is another aspect of the disclosed embodiments to provide for methods and systems for detecting the loss of a neutral voltage connection in an electrical meter.

It is a further aspect of the disclosed embodiments to provide for methods and systems for detecting when a neutral current is zero.

The aforementioned aspects and other objectives can now be achieved as described herein.

In an embodiment, a method for detecting a neutral voltage connection, can involve: determining when a value of a neutral current is equal to zero, wherein the neutral current comprises a difference between a current flowing through two legs of an electrical meter to an end customer, wherein each of the two legs comprises a first voltage with respect to a ground and a second voltage with respect to one another; and verifying that the neutral current has been detected to zero, in response to determining that the value of the neutral current is equal to zero.

In an embodiment of the method, determining when the value of the neutral current is equal to zero can involve subtracting a current of one of the two legs from a current of the other leg of the two legs.

An embodiment of the method can further involve determining the value of an average current is equal to adding a current of one of the two legs to the current of the other leg of the two legs and dividing the sum by 2.

An embodiment of the method can further involve automatically generating a notification that the neutral current has been detected, in response to verifying the detection of the neutral current.

An embodiment of the method can further involve automatically generating a follow-up notification that the neutral current has been detected again after a period of time.

An embodiment of the method can further involve using a fixed threshold for the neutral current.

An embodiment of the method can further involve confirming that the neutral current has been detected to zero by comparing a ratio of the neutral current to an average current of the two legs.

In another embodiment, a system for detecting a neutral voltage connection, can include an electrical meter; and at least one sensor that communicates electrically with the electrical meter, wherein the at least one sensor determines when a value of a neutral current is equal to zero, the neutral current comprising a difference between a current flowing through two legs of the electrical meter to an end customer, wherein each of the two legs comprises a first voltage with respect to a ground and a second voltage with respect to one another, and wherein a detection of the neutral current to zero is verified, in response to determining that the value of the neutral current is equal to zero.

In an embodiment of the system, determining when the value of the neutral current is equal to zero can include subtracting a current of one of the two legs from a current of the other leg of the two legs.

An embodiment of the system can further include determining the value of an average current is equal to adding a current of one of the two legs to the current of the other leg of the two legs and dividing the sum by 2.

In an embodiment of the system, a notification that the neutral current has been detected to zero by the at least one sensor can be automatically generated, in response to verifying the detection of the neutral current.

In an embodiment of the system, a follow-up notification that the neutral current has been detected again can be automatically generated after a period of time.

In an embodiment of the system, the at least one sensor can confirm that the neutral current has been detected by comparing a ratio of the neutral current to an average current of the two legs.

In an embodiment of the system, a fixed threshold can be used for the neutral current.

In another embodiment, a system for detecting a neutral voltage connection, can further include: at least one processor; and a non-transitory computer-usable medium embodying computer program code, the computer-usable medium capable of communicating with the at least one processor. The computer program code can include instructions executable by the at least one processor and configured for: determining when a value of a neutral current is equal to zero, wherein the neutral current comprises a difference between a current flowing through two legs of an electrical meter to an end customer, wherein each of the two legs comprises a first voltage with respect to a ground and a second voltage with respect to one another; and verifying that the neutral current has been detected to zero, in response to determining that the value of the neutral current is equal to zero.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
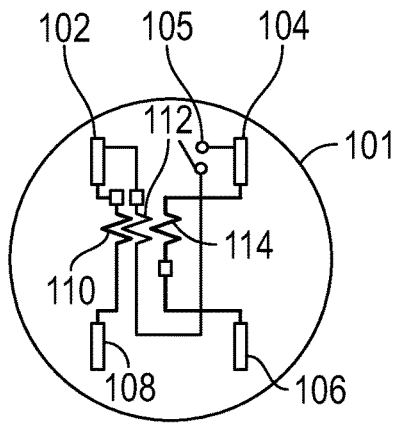
FIG. 1 illustrates a connection diagram depicting a prior art 2S meter used to measure a single-phase 3-wire service.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Form 2S meters are single element meters. They can multiply a single voltage (the voltage across the two "hot" blades) by a single current (the average current in the two current legs) to come up with an overall energy for the meter as a whole. This calculation may be done in several different ways. The averaging of the current legs can be accomplished in an analog manner (i.e., run both currents through a single sensor) to multiply against the line-to-line voltage (240V). Or each current could be measured separately and multiplied by ½ of the line-to-line voltage (120V, which is an approximation). If, however, the two currents are measured separately, then additional computations can be done to the values.

Note that the term 'current' as utilized herein can refer to electrical current or electric current. In addition the term 'meter' as utilized herein can refer to an electrical meter, an electricity meter, an electric meter, or energy meter, which is a device that can measure the amount of electric energy consumed by, for example, a residence, a business, or an electrically powered device. Electric utilities use electric meters installed at customers' premises for billing and monitoring purposes.

Figure 2:
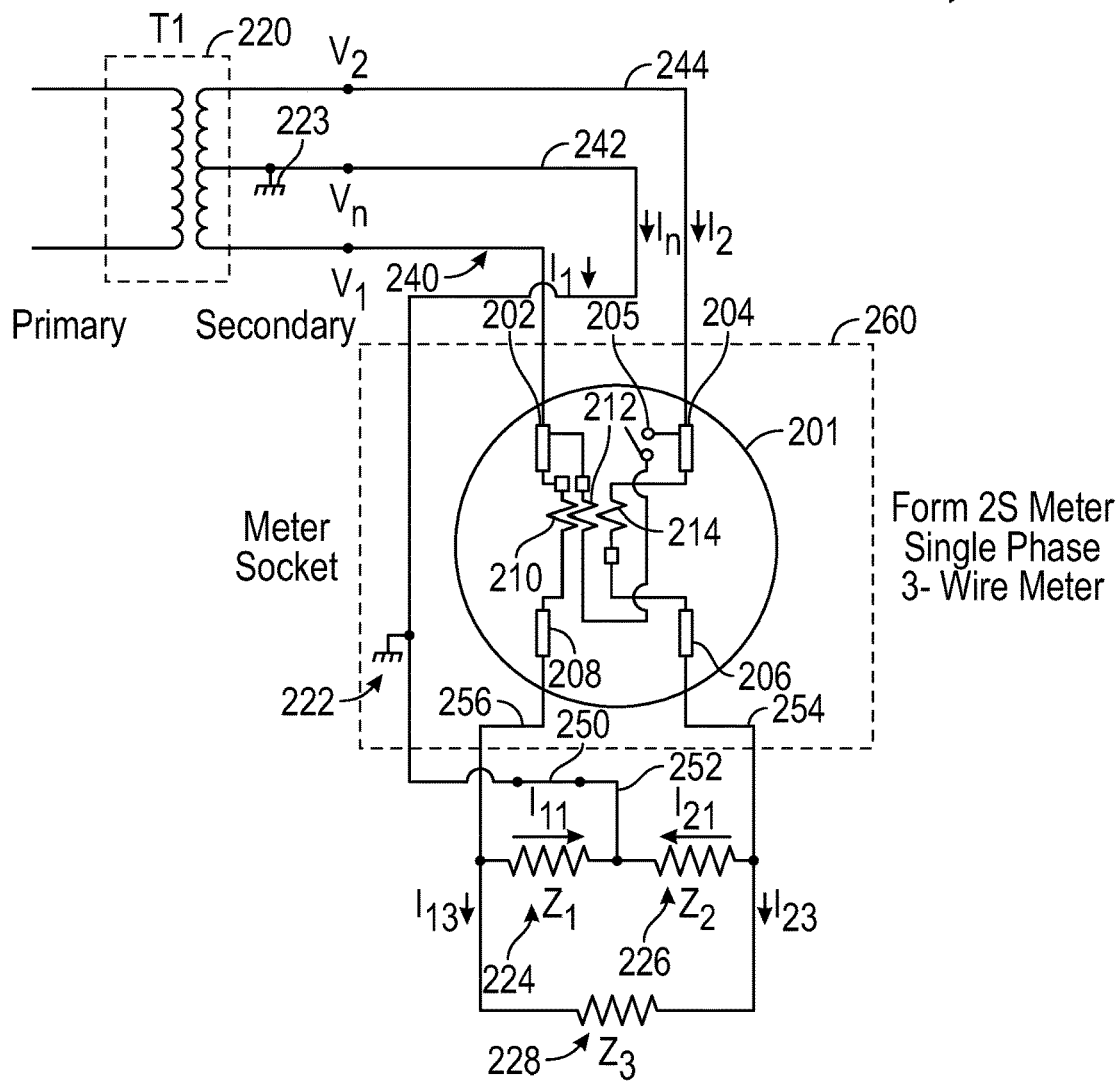
FIG. 2 illustrates a schematic diagram of a single-phase 3-wire service being measured with a Form 2S meter, in accordance with an embodiment.

FIG. 2 illustrates a schematic diagram of an electrical circuit 200, in accordance with an embodiment. The electrical circuit 200 shown in FIG. 2 can be implemented as a Form 2S meter, and/or as part of a system such as the system 450 depicted in FIG. 5 and the system 460 depicted in FIG. 6. Note that although the electrical circuit 200 has also been discussed in the background section herein, the electrical circuit 200 should not be considered 'prior art'. FIG. 2 discussed below is presented herein in the context of explaining an embodiment for detecting the loss of a neutral voltage connection rather than as prior art. Thus, the discussion of FIG. 2 presented earlier in the background section of this application should not be construed as constituting AAPA (Applicant Admitted Prior Art).

As shown in FIG. 2, the electrical circuit 200 depicts the meter service, which can include the utility's transformer 220, the distribution wires to the meter socket box 260, the meter 201, the wiring from the meter to the residence as indicated by wire 254 and wire 256 and the load in the residence as indicated by load 224, load 226 and load 228.

The utility distribution transformer 220 (that can include primary and secondary windings as shown in FIG. 2) can supply voltage and current through wires 240, 242 and 244. Wire 242 can be tied to the Neutral connection of the transformer 220 and may also be typically tied to ground at connection 223 near the transformer itself. The wire 242 can be referred to as the Neutral wire or the Ground wire. The wire 240 and the wire 244 on typical residential single-phase 3-wire services can have voltages that are nominally 120V with respect to wire 242, and 240V with respect to each other. Wire 240 and wire 244 can be referred to as "hot" wires.

Wire 240, wire 242 and wire 244 can run from the transformer to the residence and into a socket box 260, which may be mounted on the residence. The socket box 260 can serve as a place to mount the meter, which can measure energy flow from the utility wires 240 and 244 to the customer wires 254 and 256.

The meter depicted in FIG. 2 can include four blades 202, 204, 206 and 208. The two "hot" voltage wires 240 and 244 from the transformer are tied to the utility line side blades 202 and 204 respectively. A current sensor 210 is located in the current path between the blade 202 and the blade 208. Another current sensor 214 can be located in the current path between the blade 204 and the blade 206. A voltage sensor 212 can be located in a current path between the blade 202 and the blade 204. A disconnect link 205 (which is closed in normal operation) can also be located in series with the voltage sensor 212, and between the voltage sensor 212 and the blade 204. The customer load side blades 208 and 206 can be electrically tied to the customer load lines 256 and 254 respectively. It should be noted that the Neutral/Ground wire 242 can run from the transformer into the socket box 260. Within the socket box, the Neutral/Ground wire can be typically again tied to ground (at the residence) and can be then run out of the socket box to the customer loads without being electrically connected to the Form 2S meter.

From the meter the energy can flow through wires 254 and 256 to the residential loads. The residential loads can include a small number of large loads connected between wire 254 and wire 256, which can expect to see voltages of a nominal 240V. The conglomeration of these loads is shown in FIG. 2 as an impedance or load 228 (Z3); however, the larger number of loads in a typical residence may expect to see voltages of a nominal 120V. The service provides two separate 120V circuits to the residence, and residences are wired to try to distribute the 120V loads as evenly as possible. One of the 120V circuits is supplied from 256 to 252 with the conglomeration of 120V loads depicted as an impedance or load 224 (Z1), and the other 120V circuits can be supplied from wire 254 to wire 252 with the conglomeration of 120V loads depicted as an impedance or load 226 (Z2).

There are three wires supplied from the distribution transformer to the residence. There are two "hot" wires 240 and 242, which are intended to supply all the current (I1 and I2 respectively) to supply the energy to the residence, and one Neutral wire 242 to return any current imbalance IN due to imbalanced 120V loads. The intention is that the customer loads be as equally balanced as possible so that the two currents are the same. Real world loads, however, may not be perfectly balanced; so there needs to be a means to return current from the imbalance of the 120V loads, and this can be found with IN.

The two main currents supplied from the distribution transformer are I1 (which is supplied on wire 240 through the meter 201 and to the load wire 256) and I2 (which is supplied on wire 244 through the meter 201 and to the load wire 254). The current I1 is then broken to supply two different loads: I11 supplies the 120V load 224, and I13 supplies the 240V load 228. The current I2 is then broken to supply two different loads: I21 supplies the 120V load 226, and I23 supplies the 240V load 228. I13 and I23 are by definition of equal magnitude and opposite sign, and will therefore cancel each other out. The electrical node 252 has IN, I11 and I21 all feeding it. Therefore IN equals the negated sum of I11 and I21 (currents through 224 and 226 respectively). Since I13 and I23 are equal magnitude and opposite phase, they will cancel out, and that means the IN also equals the negated sum of I1 and I2.

The schematic depicted in FIG. 2 also indicates a switch 250. This is not an actual switch, but is intended to represent the location that an "opening" of the Neutral/Ground connection may occur and cause problems. In normal operation the wire 242 may be tied to the Neutral of the transformer 220, and can be grounded at the transformer 223 and at the meter socket 222, and can be tied to 252 (with switch 250 being closed).

One of the goals of the embodiments is to be able to detect if the switch 250 has become open (referred to as "Open Neutral"). If the switch 250 is open, the current IN with respect wire 242 will be 0. However, since wire 242 may not go through the meter 201, the meter may not directly measure the current IN. But, the current I1, which can flow through wire 240 and wire 256, may go through the meter and it may be possible to measure this current. Also, the current I2, which can flow through wire 244 and wire 254, does go through the meter and it may be possible to measure this current. And as previously noted, IN can be calculated as the negated sum of I1 and I2.

As mentioned before, it is very unlikely that the loading on each current leg would be identical. This could happen from a line-to-line load being applied. But if separate loads are applied from line to Neutral, then it is unlikely that the loads are identical. If the loads are not identical, then the currents from each "hot" leg are not the same, and the current into a node must equal zero, so the current imbalance goes out through the Neutral connection. So, if most loads are not perfectly balanced and we want to determine if the Neutral connection is still valid, then we should be able to determine whether the Neutral current is equal to zero or not, and then we would have an indication of the connection status.

Once the condition is detected, then the question is what to do about it. Most meters are now connected to some type of communications network; so one option would be to send a warning or notification to the system that this condition has been detected. This would allow the utility to potentially do some additional diagnostics (maybe to see how much current is flowing in the two current legs). And once they are convinced that there is a potential issue, they may do something remotely (like disconnect the meter), or send a utility truck to the site to diagnose the issue.

Additionally, it is becoming almost the norm for residential Form 2S meters to include an integrated disconnect switch. The integrated disconnect switch disconnects the load side blades from the line side blades, removing power from the residence. Use of this function in conjunction with the detection of a lost Neutral connection could be a means of protecting the homeowner from having an over-voltage condition within the residence.

But detection of a transient zero Neutral current condition is probably not sufficient evidence to remove someone's power. Current measurements could be as fast as individual samples (fractions of a millisecond) to multiple second averages. As loads are applied one leg may have more current than the other, but with changing loads the other leg may have larger current values. During the transition time, it may be possible to have a point where the two currents are the same, but we do not want to make a false detection at that point so some additional checking may need to be accomplished. A first feature that can enhance the functionality may involve adding a time component to the checking of the Neutral current.

As discussed above, a transient zero Neutral current detection may most likely not indicate a real problem. In most residences (with the exception of a few large appliances such as heating, AC, stove, dryer, etc.), the majority of loads are 120V (i.e., lights and most anything that plugs into normal wall outlets). So, the likelihood of having the exact same loading on both current legs (and the associated zero Neutral current) may probably not be very high, especially for a long period of time (e.g., minutes to hours).

One other consideration is that there may be a valid load condition where no Neutral current may flow for extended periods of time. This situation may occur when no load is applied to the service at all. This scenario might happen on a new home construction before real loads can be applied, or vacation homes where the power has been turned off at the housebreaker, and possibly other scenarios. The point is, however, that there may need to be some determination as to whether there is any current in the separate legs before the Neutral current detection can be validated. This detection can result from looking at either current separately or looking at the average of the two current legs.

For purposes of an example, one possible means to implement this detection may be to calculate the ratio of the Neutral current to the average current of the two legs, and decide that the condition was met if the ratio was below some percentage for some period of time. In this manner, as the actual average load current dropped, then any Neutral current may be a larger and larger ratio. Under No Load or Low Load conditions, the failing condition may be unlikely to be detected.

Neutral current calculations can be made indirectly since there is no current sensing element on the Neutral current itself. This can be accomplished by adding (or subtracting) the current of one leg from the other leg (the Form 2S meter reverses the current in the right leg and then adds it to the current from the left leg, and implements a divide by 2 to get the average). If this measurement is accomplished digitally, the two current signals may be combined, and the sign of the signals may depend on the current sensors, physical orientation, connector and printed circuit board layout, etc. So, depending on all the different factors the averaging may be done with an addition or subtraction (for convenience purposes, future descriptions may refer to adding the signals for averaging purposes).

Similarly, the Neutral current calculates the difference between the two currents. Actual implementation may add or subtract the signals, depending on the previously described physical implementation details, but for convenience purposes, future descriptions will refer to subtracting the signals for difference calculation (Neutral current calculation) purposes.

It may be possible to implement this Neutral current measurement in an analog fashion by using another current sensing method that routs both current legs through a current sensor in the same direction (e.g., same as the average current measurement but with one of the currents in the opposite direction). Thereafter, this signal can be independently measured as a calculated Neutral current. It may be more reasonable, however, to simply have each current leg measured independently, and let the firmware in the metering engine perform the average calculations and the Neutral current calculations from the same inputs.

Calculation of the Neutral current may need to be implemented on a sample-by-sample basis, and the resultant root means square (rms) Neutral current can be calculated directly. This is in comparison to making calculations of the rms current in each leg, and then comparing the two rms current magnitudes. The reason is that the use of simple rms magnitudes may not include the phase angle between the signals. One may have two different rms signals that have the same magnitude, but the difference of the two signals may not be zero on a sample-by-sample basis (it may be possible to accomplish this comparison if a phase angle associated to each magnitude is available, but even that may have issues when harmonically distorted signals are being evaluated).

The discussion up to this point has concerned Form 2S meters. The problem is also potentially applicable to the use of Form 12S meters as well. The 12S meter (as well as similar self-contained 2-element meters: Forms 13S, 25S, 32S, 13A) may be the proper meter type to measure a single-phase 3-wire service, and this is because the Neutral voltage connection is electrically available to the meter. These meter forms can be used to meter many more service types than just the single phase 3-wire service, but if they are used to measure this service, then this same algorithm may be still be useful in detection of a lost Neutral voltage connection in the residence. The reason is that the Neutral voltage connection that the meter has access to is on the utility side of the meter. If the Neutral voltage connection is lost inside of the consumer's housebreaker box, then it is impossible for the meter to see this with its voltage connections.

Actual calculation of Neutral current in these 2-element meters is essentially the same as with the Form 2S meter, although there may be a polarity change in one of the measured current signals, and this change in polarity must be accounted for in the Neutral current calculation. Once the Neutral current is calculated, then it could be divided by the average of the two other currents to calculate a ratio, or whatever comparison means is decided upon to decide about the potential for an open Neutral condition. Use of the same qualification time would allow a similar mechanism to do the detection for this 2-element meter as is done on the Form 2S (Note: this detection may only apply to single phase 3-wire services. This 2-element meter can measure other services, but this calculation is most probably not applicable to the other service types).

Thus, in a 3-wire single-phase meter, it may not be necessary to measure the currents independently, only the difference. 12S, on the other hand, is the standard ANSI meter form used to measure a 2-element service.

Figure 3:
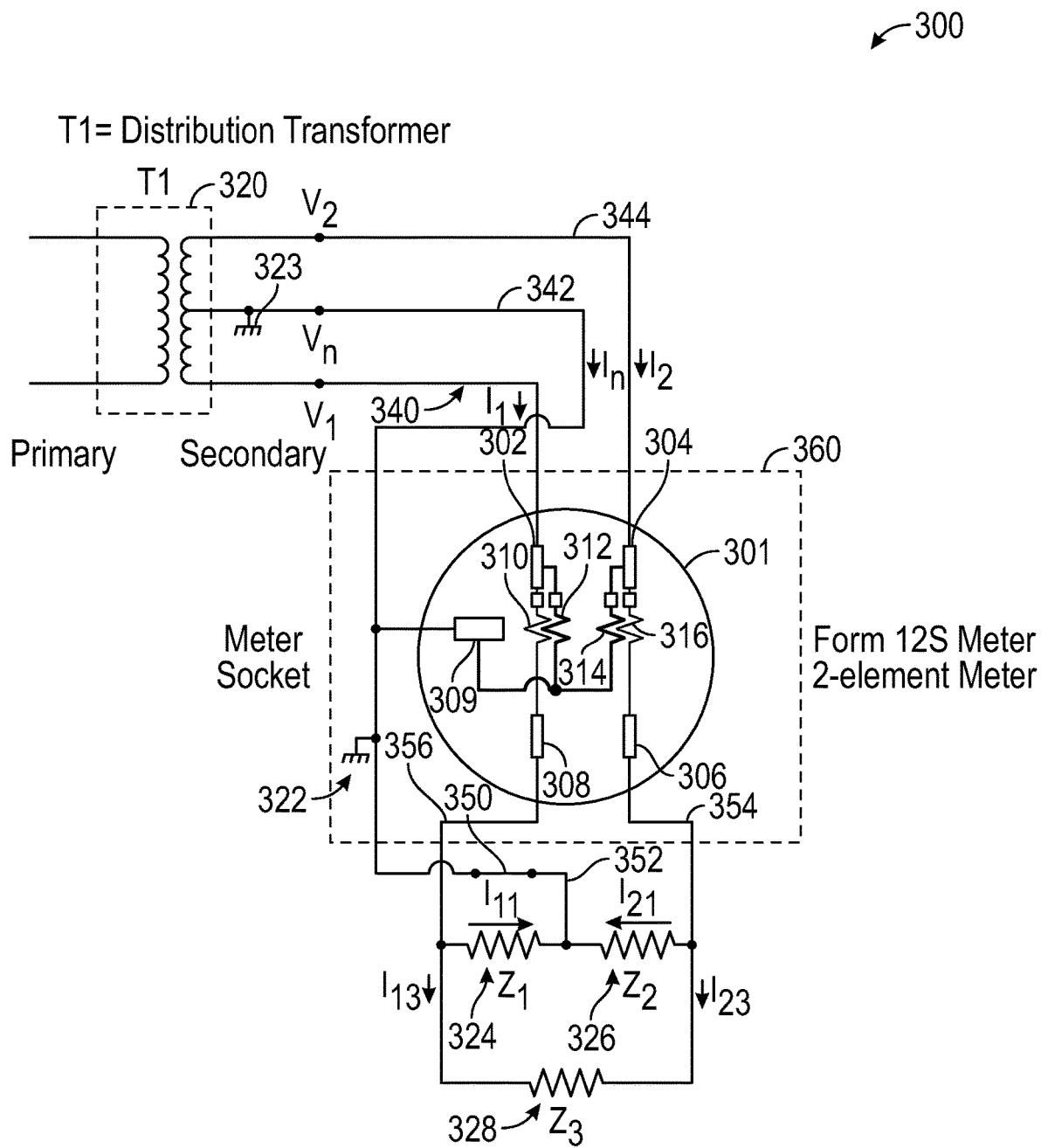
FIG. 3 illustrates a schematic diagram of a single-phase 3-wire service being measured with a Form 12S meter, in accordance with another embodiment.

FIG. 3 illustrates a schematic diagram of an electrical circuit 300, in accordance with an embodiment. The electrical circuit 300 can be implement a Form 12S, 2-element meter and/or as part of a system such as the system 450 depicted in FIG. 5 and the system 460 depicted in FIG. 6.

Note that although the electrical circuit 300 has also been discussed in the background section herein, the electrical circuit 300 should not be considered 'prior art'. FIG. 3 discussed below is presented herein in the context of explaining an embodiment for detecting the loss of a neutral voltage connection rather than as prior art. Thus, the discussion of FIG. 3 presented earlier in the background section of this application should not be construed as constituting AAPA (Applicant Admitted Prior Art).

The electrical circuit 300 shown in FIG. 3 can includes a blade 302, a blade 304, a blade 306, and a blade 308. A current sensor 310 can be located in the current path between the blade 302 and the blade 308. A voltage sensor 312 can be electrically connected to the blade 302. A voltage sensor 314 may be electrically connected to the blade 304. The voltage sensor 312 and the voltage sensor 314 can also electrically connect to a blade 309 that in turn can electrically connect to a Neutral/Ground current line 342 that electrically connects to a transformer 320 (i.e., T1—a distribution transformer). The current line 342 can also electrically connects to a ground 323 and a ground 322. The current line 342 can function as the neutral wire for the electrical circuit 300.

The electrical circuit 300 can further include a residential load, which may flow through wires 354 and 356 to the residential loads. The residential loads can include a small number of large loads connected between wire 354 and wire 356, which can expect to see voltages of a nominal 240V. The conglomeration of these loads is shown in FIG. 3 as an impedance or load 328 (Z3); however, the larger number of loads in a typical residence may expect to see voltages of a nominal 120V. The service provides two separate 120V circuits to the residence, and residences are wired to try to distribute the 120V loads as evenly as possible. One of the 120V circuits is supplied from 356 to 352 with the conglomeration of 120V loads depicted as an impedance or load 324 (Z1), and the other 120V circuits can be supplied from wire 354 to wire 352 with the conglomeration of 120V loads depicted as an impedance or load 326 (Z2).

FIG. 3 additionally illustrates a switch 350, which is similar to the switch 250 shown in FIG. 2. That is, the switch 350 depicted in FIG. 3 is not an actual switch, but is intended to represent the location that an "opening" of the Neutral/

Ground connection may occur and cause problems. The switch 350 is shown in FIG. 3 with respect to a customer neutral connection 352. In addition, FIG. 3 depicts a wire 354 and a wire 356 that may be 'hot' voltage lines as applied to the customer loads.

The 3-wire single phase service can be most accurately metered with a full 2-element meter (such as the 12S), but long ago the market decided that the approximations made by the 3-wire single phase meter were acceptable enough to justify the cost difference versus a 2-element meter. The 2-element meter uses the following formula to calculate energy:

$$Wh=[(V1-Vn)*I1]+[(V2-Vn)*I2]$$

Thus, in an 2-element meter, it may be necessary to measure the currents independently (which historically may have accounted for a large portion of the cost difference).

Looking at the different parts of the diagrams from FIG. 2 and FIG. 3:
Voltages:
V1 to Vn=120V
V2 to Vn=120V (but 180 degrees out of phase with V1 to Vn voltage)
V1 to V2=240V
Loads:
Z1, Z2 and Z3 are customer loads, whose energy usage is being measured by the meters
Z1 is the conglomerate of all the customer loads applied to the V1 to Vn voltage (120V)
Z2 is the conglomerate of all the customer loads applied to the V2 to Vn voltage (120V)
Z3 is the conglomerate of all the customer loads applied to the V1 to V2 voltage (240V)
Currents:
I1 and I2 can be both measured by both meter types (12S must measure them independently; the 2S may measure them independently but does not have to in order to implement the energy calculation).
In is not directly measured by either meter type (2S or 12S).
I1 (measured by the meter) is broken up into I13 going to the 240V load, and I11 going to the 120V load.
I2 (measured by the meter) is broken up into I23 going to the 240V load, and I21 going to the 120V load.
Since I13 & I23 are going into the same load (from opposite sides), then they have to be same, but of opposite sign.
I11 will depend on the V1 to Vn voltage and the Z1 load.
I21 will depend on the V2 to Vn voltage and the Z2 load.
Since the net current into an electrical node must equal 0, then In=−(I11+I21).
So for In to equal 0, then I11 and I21 must be of the same magnitude and opposite sign.
Unlike Z3 where there is no connection to In, Z1 and Z2 are each typically made up of many smaller loads, and are unlikely to be the same. During transitional periods (loads going on and off), the two currents may be the same as one current exceeds the other current. But for extended periods of time, it is unlikely that the two currents would remain the same, thus generating an In of exactly 0.

Thus, the disclosed approach can permit 2S meters to measure the currents I1 and I2 independently in order to be able to calculate a difference between the two. The difference between the two currents is the current In. Since the Neutral Current (In) is unlikely to equal 0 for extended periods of time in normal operation, then if it is observed to be 0 for an extended period, then there is likely another reason.

This 'other' reason is that it may be 0 and that the Neutral Current connection has become open-circuited. This typically can occur due to a bad connection, typically in the socket box (i.e. see "Meter Socket" in FIG. 2, FIG. 3, and FIG. 4) or in the customer load panel in the home. Regardless of the location, if current is not allowed to flow through the Neutral wire, then the electrical node forms where I11 and I21 meet (which is typically Neutral or ground, but half way between V1 and V2) may exist in a state where this node's voltage can move in order to balance the currents I11 and I21, and they may cancel each other out.

The movement of this node voltage, however, may cause the two "120V" voltages to vary. One may obtain a lower voltage on one leg and a higher voltage on the other leg. The larger the load difference, the larger the resultant voltage imbalance. If one voltage becomes too low, the equipment will not work. If, however, the other voltage becomes too high, then the equipment may be more likely to become physically damaged.

An optimal method for detecting this no current condition in the Neutral current wire can involve measuring it directly, but the ANSI meter forms are not set up to do this. So, the next best way is to measure it may be through an indirect measurement approach. This is not something that would typically be performed in either 2S or 12S meters, but the 12S meter has the advantage that both currents have almost certainly been measured independently already. Because most electricity meters are now digital, an additional calculation can be made to calculate the Neutral current value.

On the 2S, historically, only one current sensor was present and both currents were fed through it in the appropriate direction to effectively calculate an average current (and this requires calculation of the difference in current). So, either the two currents could be measured independently and then combined to attain an average current for the energy calculation, and a difference to calculate the Neutral Current. Alternatively, it may be possible to calculate the difference between the two currents with a single current sensor, but such a meter may still have two current sensors (one for the average and one for the difference). Consequently, the physical implementation may be likely much more expensive, so an approach involving independent current sensors may offer a basis for the most logical solution.

This concept can be described in the context of a 3-wire single-phase service because most meters can be deployed in these installations and service types. The disclosed embodiments can also be implemented with a 3-element meter on a 4-wire wye service, since that service has 3 "hot" wires and one Neutral wire.

Figure 4:
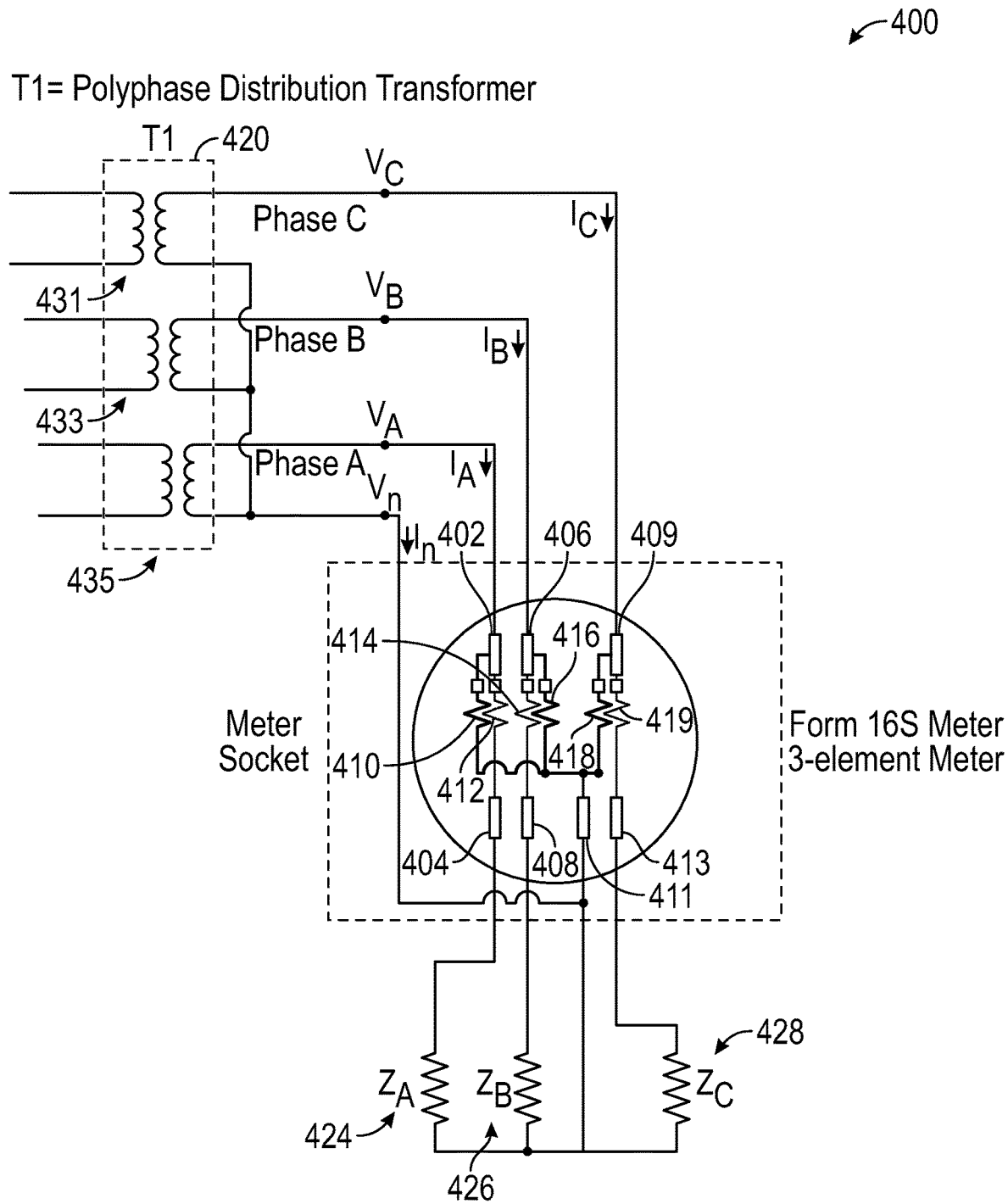
FIG. 4 illustrates a schematic diagram of a 3-phase 4-wire wye service being measured with a Form 16S meter, in accordance with an alternative embodiment.

FIG. 4 illustrates a schematic diagram of an electrical circuit 400, in accordance with an embodiment. The electrical circuit 400 can implement a Form 16 3-element meter and/or as part of a system such as the system 450 depicted in FIG. 5 and the system 460 depicted in FIG. 6.

The electrical circuit depicted in FIG. 4 can include a blade 402, a blade 404, a blade 406, a blade 408, a blade 409, a blade 411, and a blade 413. A voltage sensor 410 can be located in the circuit path between the blade 402 and the blade 411. A current sensor 412 can be located in the circuit path between the blade 402 and the blade 404. A current sensor 414 can be located in the circuit path between the blade 406 and the blade 408. Furthermore, a voltage sensor 416 can be located in the circuit path between the blade 406 and the blade 411. A voltage sensor 418 can be located in the circuit path between the blade 409 and the blade 411. In addition, a current sensor 419 can be located in the circuit path between the blade 409 and the blade 413.

The electrical circuit 400 can further include a transformer 420, which can also functions as the T1 transformer. In this case, the transformer 420 can be implemented as a polyphase distribution phase including one or more of a transformer 431, a transformer 433, a transformer 435, and so on. The transformer 435 can be implemented as Phase A, the transformer 433 as Phase B, and the transformer 431 as Phase C.

Customer or load impedances for the meter are illustrated by an impedance or load 424 (also referred to as $Z_A$), which can be connected between the blade 404 and the blade 411, an impedance or load 426 (also indicated as $Z_B$) can be connected between the blade 408 and the blade 411, and an impedance or load 428 (also referenced as $Z_C$) can be connected between the blade 413 and the blade 411. That is, the load 424, the load 426, and the load 428 can be connected electrically to one another with a common point being blade 411.

The electrical circuit 400 shown in FIG. 4 illustrates an implementation with a 3-element meter on a 4-wire wye service, since that service has 3 "hot" wires and one Neutral wire, as discussed previously. FIG. 4 depicts three currents IA, IB & IC which all flow into the same electrical node. The other current into that node is the Neutral Current. So, depending on the actual loading, there may or may not be a neutral current. It is more likely that there is just polyphase loading, and one would not expect Neutral current in that condition, but if there were any single phase loads, then that would be reason for imbalance.

The 3-element meter depicted in FIG. 4 can be used to calculate Neutral current in much the same manner: In=−(IA+IB+IC), and since the 3-element meter has to calculate currents independently already, this involves another calculation with available data. Because an open neutral connection may cause similar problems on a 4-wire wye service as it does on a 3-wire single-phase service, this calculation can be used for Open Neutral detection on this service as well.

Note that 120V line to neutral and 240V line to line are the most common nominal voltages for implementation in the US for the single-phase 3-wire service. Another nominal voltage for this service type to which one or more of the embodiments can apply can involve a 240V line to neutral and a 480V line to line. This Neutral current detection scheme can work with any single-phase 3-wire nominal line-to-line voltage, which may be center-tapped. This means that the line to neutral voltage of the two legs would be equal to ½ of the line-to-line voltage (240V and 120V are just the most common applications).

Figure 5:
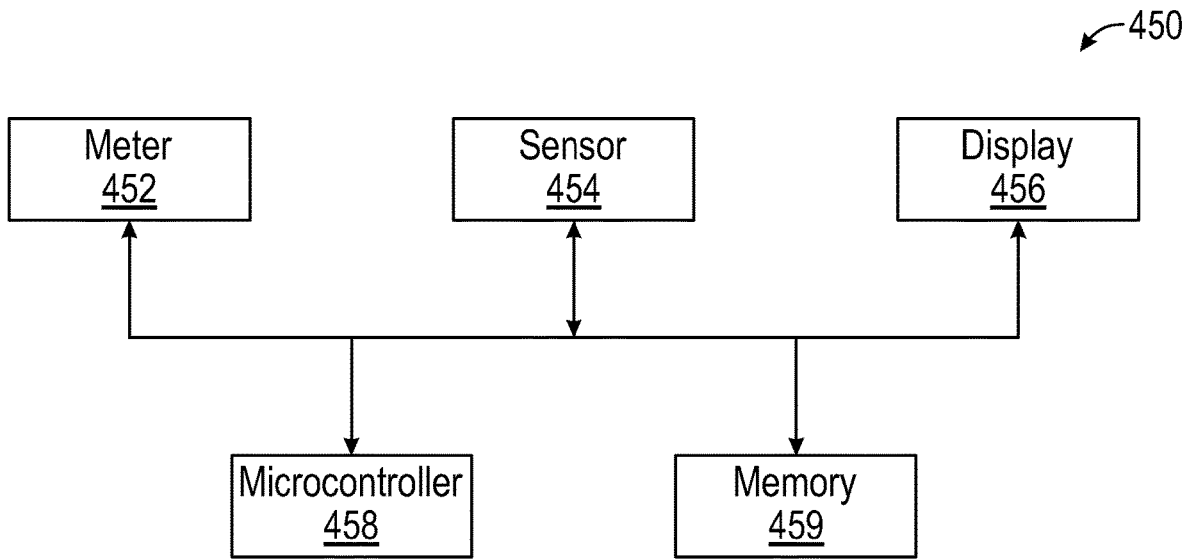
FIG. 5 illustrates a block diagram depicting a system for detecting a neutral voltage connection, in accordance with an embodiment.

FIG. 5 illustrates a block diagram depicting a system 450 for detecting a neutral voltage connection, in accordance with an embodiment. The system 450 includes an electrical meter 452 that can communicates with one or more sensors, such as a sensor 454. The electrical meter 452 and the sensor 454 can further communicate with a display 456, a microcontroller 458 and a memory 459. The memory can contain instructions (steps or operations) processed by the microcontroller 458. Such as, for example, instructions for implementing a method for detecting the neutral voltage connection discussed previously. For example, such instructions may include determining when a value of the neutral current is equal to zero, wherein the neutral current comprises a difference between a current flowing through two legs of the electrical meter 452 to an end customer, wherein each of the two legs comprises a first voltage with respect to a ground and a second voltage with respect to one another, and verifying a detection of the neutral current, in response to determining that the value of the neutral current is equal to zero. Examples of the sensor 454 include the various current sensors discussed and illustrated herein.

The step or operation of determining when the value of the neutral current is equal to zero can involve adding a current of one of the two legs from the other leg of the two legs, and subtracting a current of one of the two legs from the other leg of the two legs. Additional instructions stored in the memory 450 and performed by the microcontroller 458 can include automatically generating a notification that the neutral current has been detected, in response to verifying the detection of the neutral current, and automatically generating a follow-up notification that the neutral current has been detected again after a period of time. Such notifications may be displayed through the display 456 or may be implemented in other contexts, such as text message notification transmitted through a wireless network to a user.

In addition, the instructions stored in the memory 450 and performed by the microcontroller 458 can include confirming that the neutral current has been detected by calculating a ratio of the neutral current to an average current of the two legs, and determining that a condition of the neutral current has been met, when the ratio is below a percentage for a period of time.

The microcontroller 458 can instruct the sensor 454 to perform one or more of the instructions, steps and operations described above and elsewhere herein. The meter 452 and the sensor 454 can be implemented via one or more of the electrical circuits 200, 300, and 400 discussed previously herein. Note that the term 'microcontroller' as utilized herein can relate to a compact integrated circuit that can be designed to govern one or more specific operations in an embedded system. A typical microcontroller may include a processor, memory and input/output (I/O) peripherals on a single chip. The term 'processor', on the other hand, as utilized herein can relate to a device or a system such as a microprocessor or CPU (Central Processing Unit) that can constitute the logic circuitry that can respond to and processes the instructions that can drive a computer and other devices such as sensors, displays, etc. A processor can be responsible for interpreting most of a computer's commands. In some embodiments, a 'processor' as utilized herein can include the microcontroller 458 shown in FIG. 5 either individually or in combination with one or more other processors. Both the microcontroller 458 shown in FIG. 5 and the processor 462 depicted in FIG. 6 can processes the various steps, instructions, and operations described herein.

Figure 6:
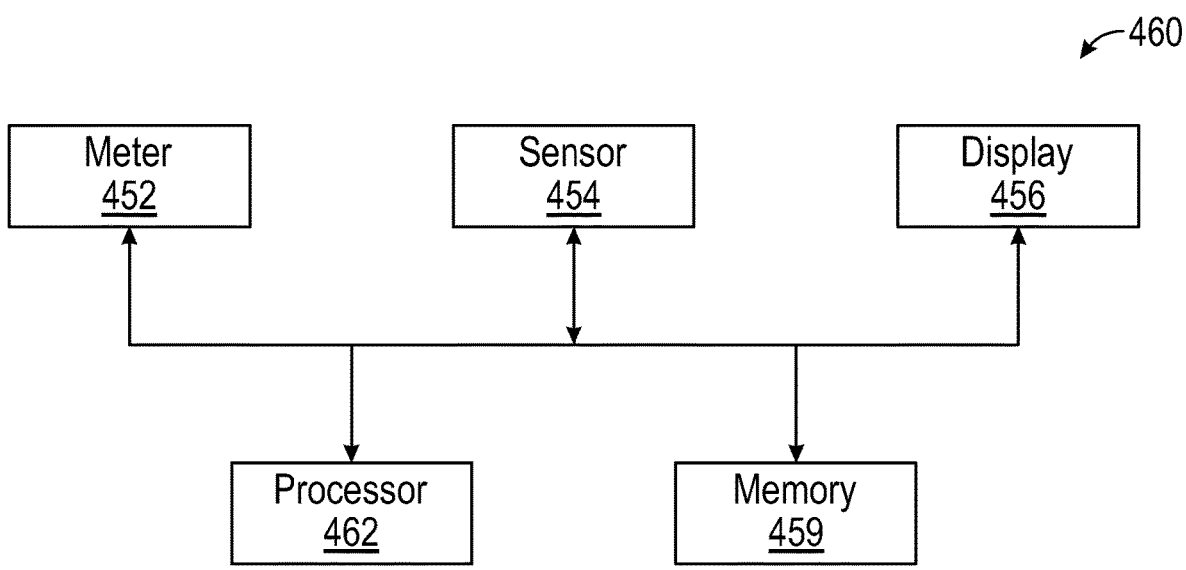
FIG. 6 illustrates a block diagram depicting a system for detecting a neutral voltage connection, in accordance with an embodiment.

FIG. 6 illustrates a block diagram depicting a system 460 for detecting a neutral voltage connection, in accordance with an alternative embodiment. Note that in FIG. 5 and FIG. 6 identical or similar parts or elements are indicated by identical reference numerals. Thus, the key difference between the system 460 shown in FIG. 6 and the system 450 depicted in FIG. 5 is that the system 460 of FIG. 6 employs a processor 462 rather than the microcontroller 458 depicted in FIG. 5.

Based on the foregoing, it can be appreciated that the embodiments relate to the detection of an open neutral of a form 2S meter with two current transformers (CTs). This detection can be achieved by determining whether the neutral current equal to zero or not. A neutral current can signify a difference between currents flowing through two legs ("two legs" signifies two "hot" lines provided to the end customer each of which has 120V with respect to ground, and 240V away from each other) of the meter. This can be accomplished by adding (or subtracting) the current of one leg from the other leg (the Form 2S meter can reverse the current in the right leg and then add it to the current from the left leg and can then implement a divide by 2 to attain the average).

For the current calculations, rms current magnitudes can be computed. The reason is that the use of simple rms magnitudes do not include phase angle between the signals. On detection of an open neutral, the meter can issue a Power Quality Monitor (PQM) event warning. The integrated disconnect switch included in the meter disconnects load side blades of the meter from line side blades, removing power from the residence. Further, to reduce false detection, a time component is added to the checking of Neutral current. The likelihood of having exact same loading on both current legs (and the associated zero Neutral current) is probably not very high, especially for a long period of time (minutes to hours).

A number of embodiments are thus disclosed herein. In one embodiment, a method for detecting a neutral voltage connection can be implemented, which includes steps, operations or instructions for determining when a value of a neutral current is equal to zero, wherein the neutral current comprises a difference between a current flowing through two legs of an electrical meter to an end customer, wherein each of the two legs comprises a first voltage with respect to a ground and a second voltage with respect to one another; and verifying that the neutral current has been detected to zero, in response to determining that the value of the neutral current is equal to zero.

In an embodiment of the method, determining when the value of the neutral current is equal to zero can further involve subtracting a current of one of the two legs from a current of the other leg of the two legs.

In another embodiment of the method, determining the value of an average current is equal to adding a current of one of the two legs to the current of the other leg of the two legs and dividing the sum by 2.

In yet another embodiment of the method, a step, operation or instructions can be implemented for automatically generating a notification that the neutral current has been detected, in response to verifying the detection of the neutral current.

In still another embodiment of the method, a step, operation or instructions can be implemented for automatically generating a follow-up notification that the neutral current has been detected again after a period of time.

In another embodiment of the method, a step, operation or instructions can be implemented for confirming that the neutral current has been detected to zero by comparing the neutral current to a fixed threshold.

In still another embodiment of the method, a step, operation or instructions can be implemented for confirming that the neutral current has been detected to zero by comparing a ratio of the neutral current to an average current of the two legs.

In another embodiment, a system for detecting a neutral voltage connection, can include an electrical meter; and at least one sensor that communicates electrically with the electrical meter, wherein the at least one sensor determines when a value of a neutral current is equal to zero, the neutral current comprising a difference between a current flowing through two legs of the electrical meter to an end customer, wherein each of the two legs comprises a first voltage with respect to a ground and a second voltage with respect to one another, and wherein a detection of the neutral current to zero is verified, in response to determining that the value of the neutral current is equal to zero.

In another embodiment of the system, determining when the value of the neutral current is equal to zero can include subtracting a current of one of the two legs from a current from the other leg of the two legs.

Another embodiment of the system can include determining the value of an average current is equal to adding a current of one of the two legs to the current of the other leg of the two legs and dividing the sum by 2.

In yet another system embodiment, a notification that the neutral current has been detected to zero by the at least one sensor can be automatically generated, in response to verifying the detection of the neutral current.

In another embodiment of the system, a follow-up notification that the neutral current has been detected again can be automatically generated after a period of time.

In still another embodiment of the system, the at least one sensor can confirm that the neutral current has been detected by comparing a ratio of the neutral current to an average current of the two legs.

In another system embodiment, the at least one sensor can confirm that the neutral current has been detected by comparing the neutral current to a fixed threshold.

In another embodiment, a system for detecting a neutral voltage connection, can include at least one processor, and a non-transitory computer-usable medium embodying computer program code. The computer-usable medium is capable of communicating with the at least one processor, and the computer program code can include instructions executable by the at least one processor and configured for: determining when a value of a neutral current is equal to zero, wherein the neutral current comprises a difference between a current flowing through two legs of an electrical meter to an end customer, wherein each of the two legs comprises a first voltage with respect to a ground and a second voltage with respect to one another; and verifying that the neutral current has been detected to zero, in response to determining that the value of the neutral current is equal to zero.

In another embodiment of the system, the aforementioned instructions can be further configured for determining when the value of the neutral current is equal to zero further comprises instructions configured for subtracting a current of one of the two legs from a current from the other leg of the two legs.

In still another system embodiment, the aforementioned instructions can be further configured for determining a value of an average current is equal to adding a current of one of the two legs to the current of the other leg of the two legs and dividing the sum by 2.

In another embodiment of the system, the aforementioned instructions can be further configured for automatically generating a notification that the neutral current has been detected, in response to verifying the detection of the neutral current.

In yet another embodiment of the system, the aforementioned instructions can be further configured for automatically generating a follow-up notification that the neutral current has been detected again after a period of time.

In another embodiment of the system, the aforementioned instructions can be further configured to use a fixed threshold for the neutral current.

In still another embodiment of the system, the aforementioned instructions can be further configured to detect a zero neutral current by comparing the neutral current to a fixed threshold for the neutral current.

In another embodiment of the system the aforementioned instructions can be further configured to detect a zero neutral current by comparing a ratio of the neutral current to an average current of the two legs.

Although the operations of the methods, systems, devices, and circuits herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations and elements for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments and elements thereof may be implemented entirely in hardware or in an implementation containing both hardware and software elements. In embodiments that use software, the software may include but is not limited to firmware, resident software, microcode, etc.

It will be appreciated that variations of the above-disclosed embodiments and examples and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A method for detecting a neutral voltage connection, comprising:
   determining when a value of a neutral current is equal to zero, wherein the neutral current comprises a difference between a current flowing through two legs of an electrical meter to an end customer, wherein the step of determination comprises subtracting a current of one of the two legs from a current of other of the two legs, wherein each of the two legs comprises hot lines corresponding to a ground connection, and wherein the hot lines comprise a first voltage with respect to the ground connection and a second voltage with respect to one another;
   verifying a detection of the neutral current, in response to determining that the value of the neutral current is equal to zero; and
   automatically generating, by at least one processor, a notification that the neutral current has been detected by at least one sensor, in response to verifying the detection of the neutral current.

2. The method of claim 1 wherein determining a value of an average current is equal to adding a current of one of the two legs to the current of the other leg of the two legs and dividing the sum by 2.

3. The method of claim 1 further comprising automatically generating, by the at least one processor, a follow-up notification that the neutral current has been detected again after a period of time.

4. The method of claim 1 further comprising:
   confirming that the neutral current has been detected to zero by comparing the neutral current to a fixed threshold.

5. The method of claim 1 further comprising:
   confirming that the neutral current has been detected to zero by comparing a ratio of the neutral current to an average current of the two legs.

6. A system for detecting a neutral voltage connection, comprising:
   an electrical meter; and
   at least one sensor that communicates electrically with the electrical meter, wherein the at least one sensor determines when a value of a neutral current is equal to zero, the neutral current comprising a difference between a current flowing through two legs of the electrical meter to an end customer, wherein the step of determination comprises subtracting a current of one of the two legs from a current of other of the two legs, wherein each of the two legs comprises hot lines corresponding to a ground connection, wherein the hot lines comprise a first voltage with respect to the ground connection and a second voltage with respect to one another, wherein a detection of the neutral current is verified, in response to determining that the value of the neutral current is equal to zero, and wherein the system includes at least one processor that automatically generates a notification that the neutral current has been detected by the at least one sensor, in response to the verified detection of the neutral current.

7. The system of claim 6 wherein determining the value of an average current is equal to adding a current of one of the two legs to the current of the other leg of the two legs and dividing the sum of the currents by 2.

8. The system of claim 6 wherein the at least one processor automatically generates a follow-up notification that the neutral current has been detected again after a period of time.

9. The system of claim 7 wherein the at least one sensor confirms that the neutral current has been detected by comparing a ratio of the neutral current to an average current of the two legs.

10. The system of claim 6 wherein the at least one sensor confirms that the neutral current has been detected by comparing the neutral current to a fixed threshold.

11. A system for detecting a neutral voltage connection, comprising
    at least one processor; and
    a non-transitory computer-usable medium embodying computer program code, the computer-usable medium capable of communicating with the at least one processor, the computer program code comprising instructions executable by the at least one processor and configured for:
    determining when a value of a neutral current is equal to zero, wherein the neutral current comprises a difference between a current flowing through two legs of an electrical meter to an end customer, wherein the step of determination comprises subtracting a current of one of the two legs from a current of other of the two legs, wherein each of the two legs comprises hot lines corresponding to a ground connection, and wherein the hot lines comprise a first voltage with respect to the ground connection and a second voltage with respect to one another;

verifying a detection of the neutral current, in response to determining that the value of the neutral current is equal to zero; and automatically generate, by at least one processor, a notification that the neutral current has been detected by at least one sensor, in response to verifying the detection of the neutral current.

12. The system of claim 11 wherein the instructions are further configured for determining a value of an average current is equal to adding a current of one of the two legs to the current of the other leg of the two legs and dividing the sum by 2.

13. The system of claim 11 wherein the instructions are further configured to detect a zero neutral current by comparing the neutral current to a fixed threshold for the neutral current.

14. The system of claim 11 wherein the instructions are further configured to detect a zero neutral current by comparing a ratio of the neutral current to an average current of the two legs.

* * * * *